US011719722B2

(12) United States Patent
Yamazaki

(10) Patent No.: US 11,719,722 B2
(45) Date of Patent: Aug. 8, 2023

(54) SENSOR AND ELECTRIC DEVICE

(71) Applicant: KABUSHIKI KAISHA TOSHIBA, Tokyo (JP)

(72) Inventor: Hiroaki Yamazaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/668,264

(22) Filed: Feb. 9, 2022

(65) Prior Publication Data

US 2023/0079378 A1 Mar. 16, 2023

(30) Foreign Application Priority Data

Sep. 14, 2021 (JP) ................................ 2021-149129

(51) Int. Cl.
*G01R 1/20* (2006.01)
*G01R 19/00* (2006.01)

(52) U.S. Cl.
CPC ......... *G01R 1/203* (2013.01); *G01R 19/0092* (2013.01)

(58) Field of Classification Search
CPC ............................ G01R 1/203; G01R 19/0092
USPC .......................................................... 324/126
See application file for complete search history.

(56) References Cited

U.S. PATENT DOCUMENTS

2010/0000324 A1* 1/2010 Yoshikawa ........... G01P 15/125 73/514.32
2015/0308828 A1* 10/2015 Jomori ................. G01C 19/574 73/504.12
2017/0108391 A1* 4/2017 Ikehashi ................... G01L 9/12
2021/0175035 A1* 6/2021 Yamazaki ............ H01H 1/0036

FOREIGN PATENT DOCUMENTS

JP 2020-180895 A 11/2020

* cited by examiner

*Primary Examiner* — Tung X Nguyen
*Assistant Examiner* — Robert P Alejnikov, Jr.
(74) *Attorney, Agent, or Firm* — Finnegan, Henderson, Farabow, Garrett & Dunner, LLP

(57) ABSTRACT

According to one embodiment, a sensor includes a base including a first face, and a first structure body fixed to the first face. The first structure body includes first and second support portions, a first movable portion, and a first fixed electrode. The first support portion is fixed to the first surface. The second support portion is fixed to the first face and provided around the first support portion. The first movable portion is supported by the first and second support portions and apart from the base. The first fixed electrode is fixed to the first face. The first movable portion includes a first movable electrode and a first conductive member. A first current is configured to flow the first conductive member. The first fixed electrode faces the first movable electrode. A first gap is provided between the first fixed electrode and the first movable portion.

20 Claims, 10 Drawing Sheets

SP
11R
12R
111
SB1
50s
85
10A
31
11
12
41
21
Y
Z
X
(D1)

38b
38a
38ae
111
38af
10A
31
38bf
38a
38b
38be
38b
38a
11
12
Y
Z
X
(D1)
38a
38b 11
31d
12
31e
SB1
112
10A
31h
31
31a
31b
11R
31g
31f
12R
31c
Y
Z
X
(D1)

31d
SB1
113
31e
12
31h
11
10A
Dc
31
31b
31a
11R
31g
31f
Y
Z
X
(D1)
31c
12R

SP1
11R
12R
114
SB1
50s
10A
85
31
iD
11
12
41
21
i2
SP2
Dx2
SB2
14R
10B
13R
32
B1
B2
13
14
42
22
Y
Z
X
(D1)

SENSOR AND ELECTRIC DEVICE

CROSS-REFERENCE TO RELATED APPLICATIONS

This application is based upon and claims the benefit of priority from Japanese Patent Application No. 2021-149129, filed on Sep. 14, 2021; the entire contents of which are incorporated herein by reference.

FIELD

Embodiments described herein relate generally to a sensor and an electric device.

BACKGROUND

For example, there is a sensor that detects current. Practical sensors and electric devices are desired.

DETAILED DESCRIPTION

Figure 1A:
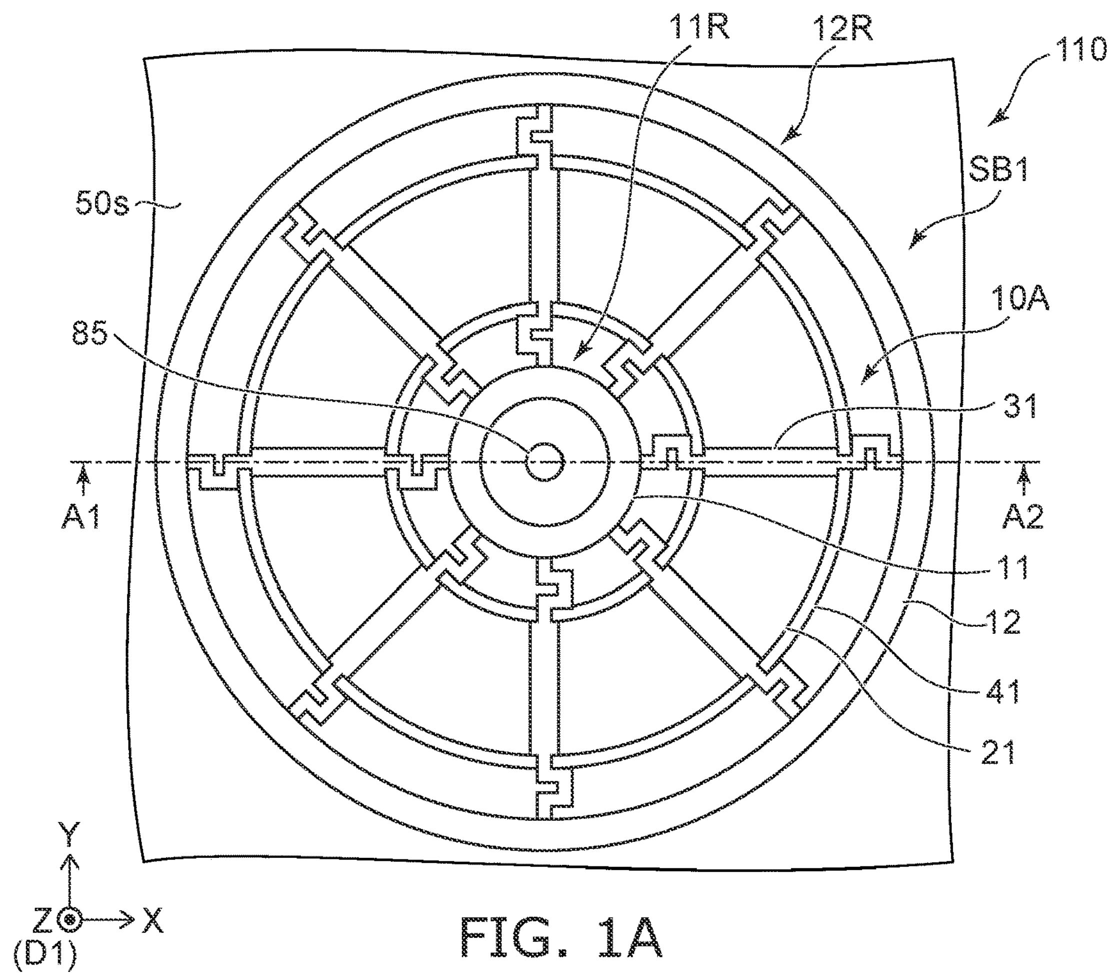
FIGS. 1A and 1B are schematic views illustrating a sensor according to a first embodiment.

According to one embodiment, a sensor includes a base including a first face, and a first structure body fixed to the first face. The first structure body includes a first support portion, a second support portion, a first movable portion, and a first fixed electrode. The first support portion is fixed to the first surface. The first support portion includes one or a plurality of first support regions. The one first support region is annular. The first support regions are arranged annularly. The second support portion is fixed to the first face and provided around the first support portion. The second support portion includes one or a plurality of second support regions. The one second support region is annular. The second support regions are arranged annularly. The first movable portion is supported by the first support portion and the second support portion and apart from the base in a first direction crossing the first face. The first fixed electrode is annular and fixed to the first face. The first movable portion includes a first movable electrode being annular, and a first conductive member. A first current is configured to flow the first conductive member. The first current is along a first radial direction from the first support portion to the second support portion. The first current has at least one of a first orientation from the first support portion to the second support portion or a second orientation from the second support portion to the first support portion. The first fixed electrode faces the first movable electrode. A first gap is provided between the first fixed electrode and the first movable portion.

According to one embodiment, an electric device includes the sensor described above, and an electric circuit. A detection target current is configured to flow through the electric circuit. The detection target current is configured to pass through a first space. The first support portion is around the first space, and the detection target current includes a component in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
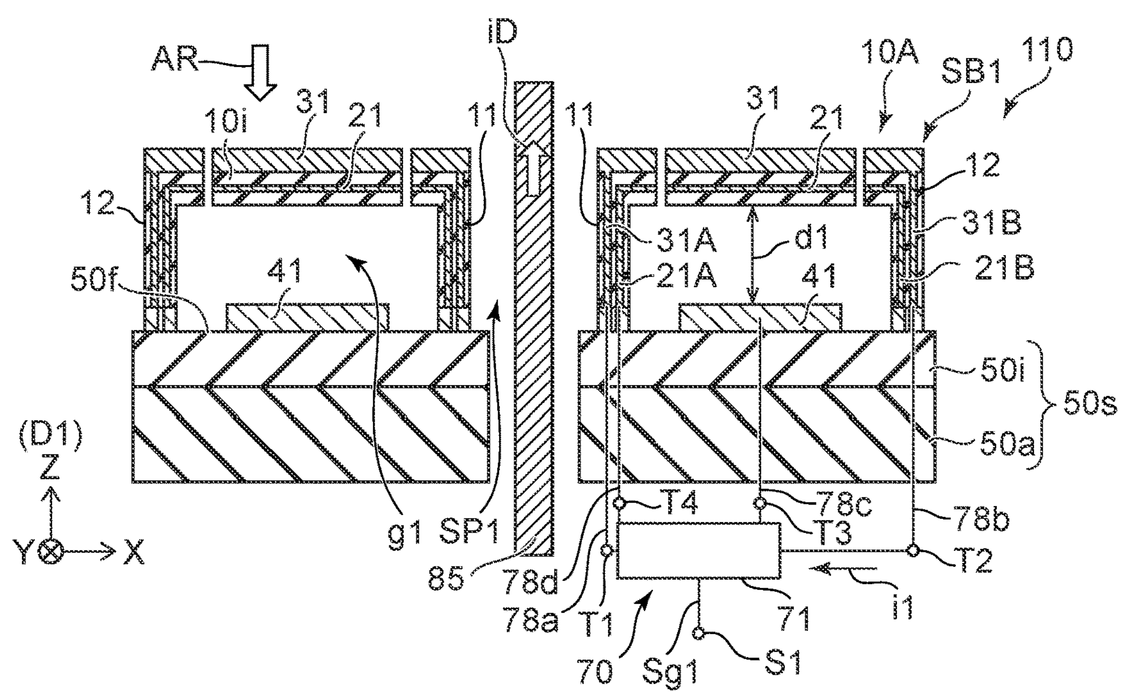

FIGS. 1A and 1B are schematic views illustrating a sensor according to a first embodiment.

Figure 2:
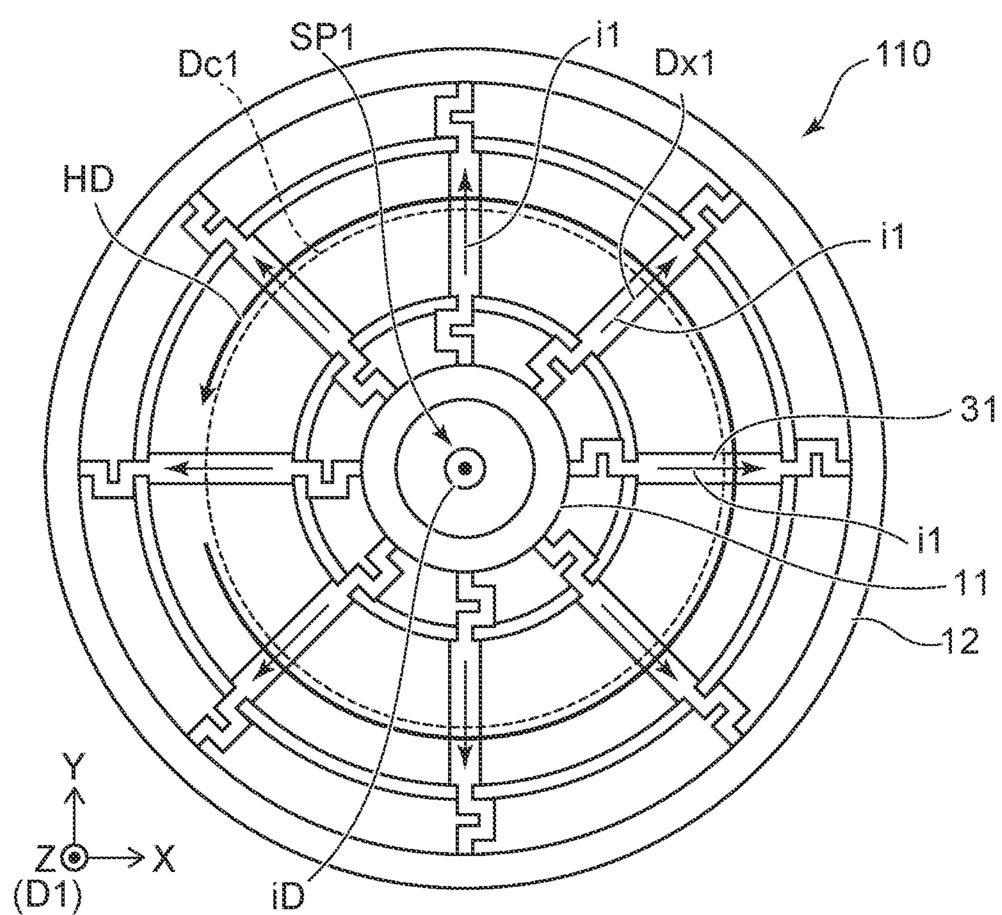
FIG. 2 is a plan view illustrating the sensor according to the first embodiment.

FIG. 2 is a plan view illustrating the sensor according to the first embodiment.

FIG. 1A is a transparent plan view seen along the arrow AR of FIG. 1B, FIG. 1B is a cross-sectional view taken along the line A1-A2 of FIG. 1A.

As shown in FIGS. 1A and 1B, a sensor 110 according to the embodiment includes the base 50*s* and the first structure body SB1.

The base 50*s* includes a first face 50*f*; In this example, the base 50*s* includes a base member 50*a* and a base insulating layer 50*i*, A base insulating layer 50*i* is provided on the base member 50*a*. The first face 50*f* is, for example, the upper face of the base insulating layer 50*i*.

A direction perpendicular to the first face 50*f* is a Z-axis direction. One direction perpendicular to the Z-axis direction is defined as an X-axis direction. The direction perpendicular to the Z-axis direction and the X-axis direction is defined as a Y-axis direction.

The first structure body SB1 is fixed to the first face 50*f*. For example, the first structure body SB1 is provided on the first face 50*f*.

The first structure body SB1 includes a first support portion 11, a second support portion 12, a first movable portion 10A, and a first fixed electrode 41.

As shown in FIG. 1B, the first support portion 11 is fixed to the first face 50*f*. As shown in FIG. 1A, the first support portion 11 includes one or more first support regions 11R. In this example, one first support region 11R is provided. For example, this one first support region 11R is annular. As will be described later, when a plurality of first support regions 11R are provided, the plurality of first support regions 11R are arranged annularly.

As shown in FIG. 1B, the second support portion 12 is fixed to the first face 50*f*. As shown in FIG. 1A, the second support portion 12 is provided around the first support portion 11. The second support portion 12 includes one or more second support regions 12R. In this example, one second support region 12R is provided. This one second support region 12R is annular. As will be described later, when a plurality of second support regions 12R are provided, the plurality of second support regions 12R are arranged annularly.

For example, an annular second support portion 12 is provided around the annular first support portion 11. The first support portion 11 and the second support portion 12 are provided, for example, concentrically. The first support portion 11 and the second support portion 12 are, for example, concentric or coaxial.

As shown in FIG. 1B, the first movable portion 10A is supported by the first support portion 11 and the second support portion 12. The first movable portion 10A is apart from the substrate 50*s* in a first direction D1. The first direction D1 crosses the first face 50*f*. The first direction D1 is, for example, the Z-axis direction.

As shown in FIG. 1B, the first fixed electrode 41 is provided on the first face 50*f*. As shown in FIG. 1A, the first fixed electrode 41 is annular. In the X-Y plane, the first fixed electrode 41 is between the first support portion 11 and the second support portion 12.

As shown in FIGS. 1A and 1B, the first movable portion 10A includes a first movable electrode 21 and a first conductive member 31. The first movable electrode 21 is, for example, annular.

For example, in the first direction D1, the first movable electrode 21 is between the first fixed electrode 41 and the first conductive member 31. A target capacitance is effectively formed between the first fixed electrode 41 and the first movable electrode 21.

As shown in FIG. 1B, the first structure body SB1 may include an insulating member 10*i*. A part of the insulating member 10*i* may be included in the first movable portion 10A. At least a part of the insulating member 10*i* is between the first movable electrode 21 and the first conductive member 31. A part of the insulating member 10*i* may be provided between the first fixed electrode 41 and the first movable electrode 21. A part of the insulating member 10*i* may be included in the first support portion 11 and the second support portion 12.

As shown in FIG. 2, a first current i1 can flow through the first conductive member 31. The first current it is along the first radiation direction Dx1 from the first support portion 11 to the second support portion 12. The first current i1 has at least one of a first orientation from the first support portion 11 to the second support portion 12 or a second orientation from the second support portion 12 to the first support portion 11. In this example, the first current it has the first orientation from the first support portion 11 to the second support portion 12.

As shown in FIG. 1B, the first fixed electrode 41 faces the first movable electrode 21. A first gap g1 is provided between the first fixed electrode 41 and the first structure body SB1. The first gap g1 is provided between the first fixed electrode 41 and the first movable electrode 21. For example, the first gap g1 is provided between the first fixed electrode 41 and the first movable portion 10A.

As shown in FIGS. 1A and 1B, a detection target wiring 85 is provided. The detection target wiring 85 passes through the first space SP1 surrounded by the first support portion 11. At least a part of the detection target wiring 85 is along a direction including the component of the first direction D1. The detection target current iD flows through the detection target wiring 85. The detection target current iD passes through the first space SP1 surrounded by the first support portion 11. The detection target current iD includes a component in the first direction D1.

As shown in FIG. 2, a magnetic field HD is generated by the detection target current iD. The magnetic field HD is along a first circumferential direction Dc1 having an axis of a center of the first support portion 11. The direction of the first current it substantially crosses (for example, orthogonal to) the direction of the magnetic field HD. As a result, Lorentz force is generated in the first movable portion 10A. The direction of Lorentz force has a component of the first direction D1. As a result, the first movable portion 10A is displaced along the first direction D1. The magnitude of the Lorentz force changes according to the magnitude of the detection target current iD. The direction of the Lorentz force changes according to the direction (polarity) of the detection target current iD.

The generated Lorentz force changes a distance between the first fixed electrode 41 and the first movable electrode 21. For example, a first distance d1 between the first fixed electrode 41 and the first movable portion 10A changes. As the first distance d1 changes, the first capacitance between the first fixed electrode 41 and the first movable electrode 21 changes. That is, the first capacitance between the first fixed electrode 41 and the first movable electrode 21 changes according to the detection target current iD. By detecting the change in the first capacitance, the detection target current iD can be detected.

According to the embodiment, the detection target current iD can be detected with a simple configuration. The detection target current iD may be a DC current or an AC current.

For example, there is a reference example of detecting an electric current using a magnetic resistor. In this reference example, the manufacturing process of the detection element including the magnetic resistor is complicated. In the embodiment, no complicated manufacturing process is required. In the embodiment, the current can be detected by a simple configuration. A practical sensor can be provided.

As shown in FIG. 1B, the sensor 110 may include a controller 70. The controller 70 includes a first circuit 71. The controller 70 (for example, the first circuit 71) can supply the first current i1 to the first conductive member 31.

For example, the first structure body SB1 includes a first terminal T1 and a second terminal T2. The first terminal T1 is electrically connected with one end of the first conductive member 31. The second terminal T2 is electrically connected with the other end of the first conductive member 31. The controller 70 can supply the first current i1 to the first conductive member 31 via the first terminal T1 and the second terminal T2.

For example, the first structure body SB1 includes a conductive portion 31A and a conductive portion 318 that are electrically connected with the first conductive member 31. At least a part of the conductive portion 31A passes through the first support portion 11. At least a part of the conductive portion 318 passes through the second support portion 12. For example, the controller 70 is electrically connected with one end of the first conductive member 31 via the first terminal T1, a wiring 78*a*, and the conductive portion 31A. For example, the controller 70 is electrically connected with the other end of the first conductive member 31 via the second terminal T2, a wiring 78*b*, and the conductive portion 31B. The first current it is supplied to the first conductive member 31 via the wiring 78*a*, the wiring 78*b*, the conductive portion 31A, and the conductive portion 31B.

The controller 70 (for example, the first circuit 71) can detect the change in the first capacitance between the first fixed electrode 41 and the first movable electrode 21.

For example, the first structure body SB1 includes a third terminal T3 and a fourth terminal T4. The third terminal T3 is electrically connected with the first fixed electrode 41. The fourth terminal T4 is electrically connected with the first movable electrode 21. The controller 70 may detect a change in the first capacitance via the third terminal T3 and the fourth terminal T4.

For example, the first structure body SB1 may include a wiring 78*c* and a wiring 78*d*. The wiring 78*c* is electrically connected with the first fixed electrode 41. The wiring 78*d* is electrically connected with the first movable electrode 21. The wiring 78*d* may pass through at least one of the first support portion 11 and the second support portion 12, for example. For example, the controller 70 may detect the change in the first capacitance between the first fixed electrode 41 and the first movable electrode 21 via the third terminal 13, the fourth terminal T4, the wiring 78*c*, and the wiring 78*d*, The controller 70 can output a signal S1. The signal S1 corresponds to, for example, the change in the first capacitance.

As described above, the first capacitance changes according to the detection target current 1D. As described above, the detection target current iD passes through the first space SP1 surrounded by the first support portion 11. The detection target current iD includes a component in the first direction D1.

Figure 3A:
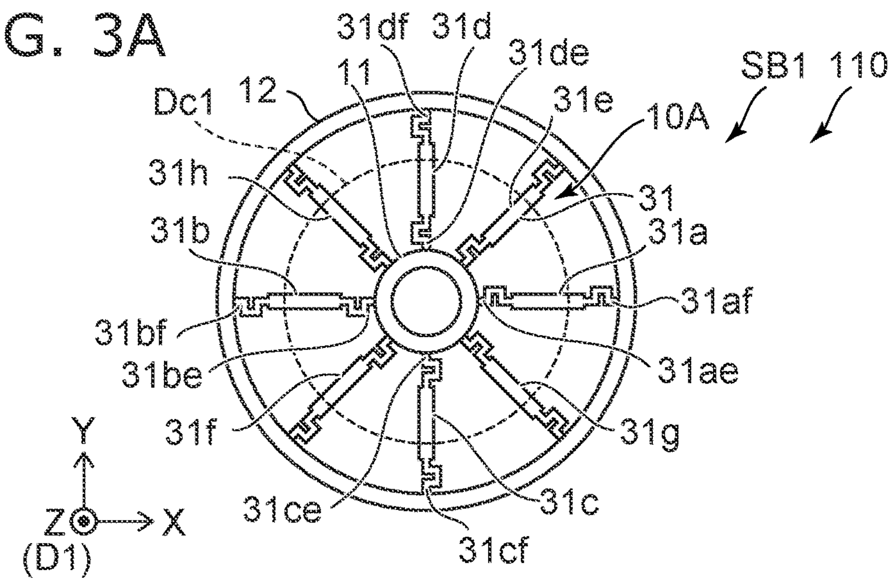
FIGS. 3A to 3C are schematic plan views illustrating the sensor according to the first embodiment.
Figure 3B:
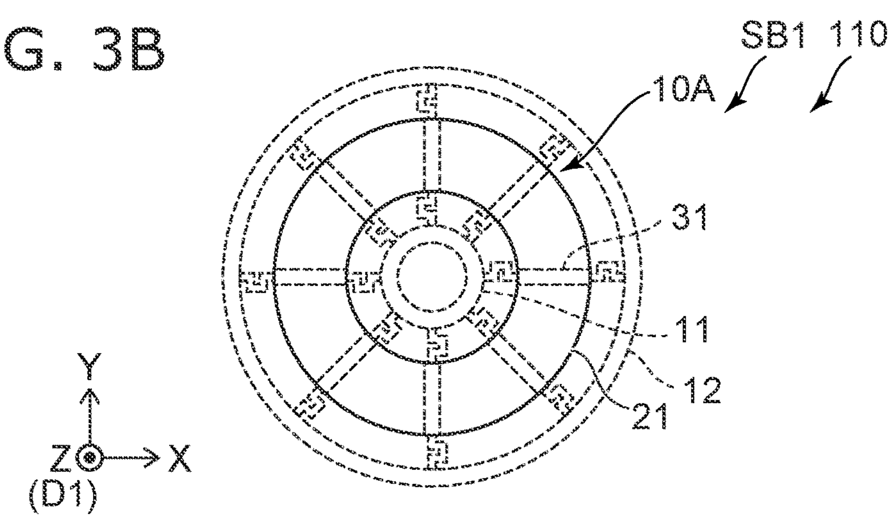
Figure 3C:
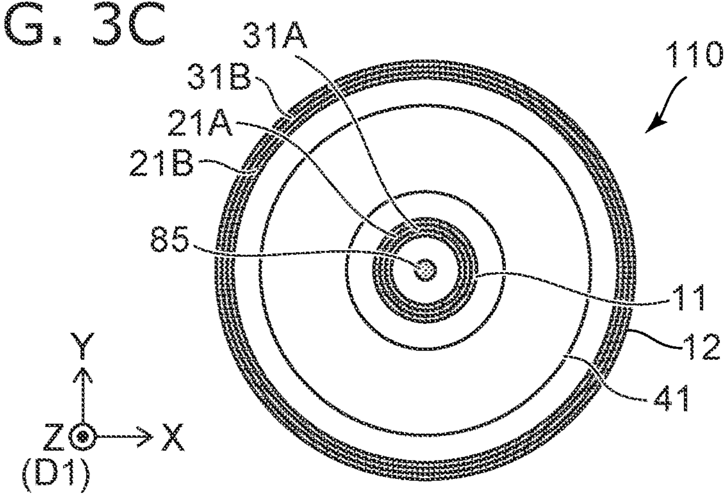

FIGS. 3A to 3C are schematic plan views illustrating the sensor according to the first embodiment.

FIG. 3A illustrates the first support portion 11, the second support portion 12, and the first conductive member 31. FIG. 3B illustrates the first movable electrode 21. FIG. 3C illustrates the first support portion 11, the second support portion 12, and the first fixed electrode 41.

As shown in FIG. 3A, in this example, the first conductive member 31 includes a first conductive portion 31*a* and a second conductive portion 31*b*. The first conductive portion 31*a* includes a first conductive portion end 31*ae* and a first conductive portion other end 31*af*. The first conductive portion end 31*ae* is connected with the first support portion 11. The first conductive portion other end 31*af* is connected with the second support portion 12.

The second conductive portion 31*b* includes a second conductive portion end 31*be* and a second conductive portion other end 31*bf*. The second conductive portion end 31*be* is connected with the first support portion 11. The second conductive portion other end 31*bf* is connected with the second support portion 12.

As shown in FIG. 3A, in this example, the first conductive member 31 includes a third conductive portion 31*c* and a fourth conductive portion 31*d*. The third conductive portion 31*c* includes a third conductive portion end 31*ce* and a third conductive portion other end 31*cf*. The third conductive portion end 31*ce* is connected with the first support portion 11. The third conductive portion other end 31*cf* is connected with the second support portion 12.

The fourth conductive portion 31*d* includes a fourth conductive portion end 31*de* and a fourth conductive portion other end 31*df*. The fourth conductive portion end 31*de* is connected with the first support portion 11. The fourth conductive portion other end 31*df* is connected with the second support portion 12.

In this example, a direction from the first conductive portion end 31*ae* to the first conductive portion other end 31*af* is along a direction from the second conductive portion other end 31*bf* to the second conductive portion end 31*be*. For example, these directions are along the X-axis direction.

For example, a direction from the third conductive portion end 31*ce* to the third conductive portion other end 31*cf* is along a direction from the fourth conductive portion other end 31*df* to the fourth conductive portion end 31*de*. For example, these directions are along the Y-axis direction.

As described above, the direction from the first conductive portion end 31*ae* to the first conductive portion other end 31*af* crosses the direction from the third conductive portion other end 31*cf* to the third conductive portion end 31*ce*.

As shown in FIG. 3A, the first conductive member 31 may include a fifth conductive portion 31*e*, a sixth conductive portion 31*f*, a seventh conductive portion 31*g*, an eighth conductive portion 31*h*, and the like. The plurality of conductive portions (first to eighth conductive portions 31*a* to 31*h*, etc.) extend along a direction crossing the first circumferential direction Dc1. The number of the plurality of conductive portions is arbitrary.

For example, the third conductive portion 31*c* may be regarded as the "second conductive portion". In this case, the direction from the first conductive portion end 31*ae* to the first conductive portion other end 31*af* crosses the direction from the "the second conductive portion end" to the "the second conductive portion other end".

Figure 4:
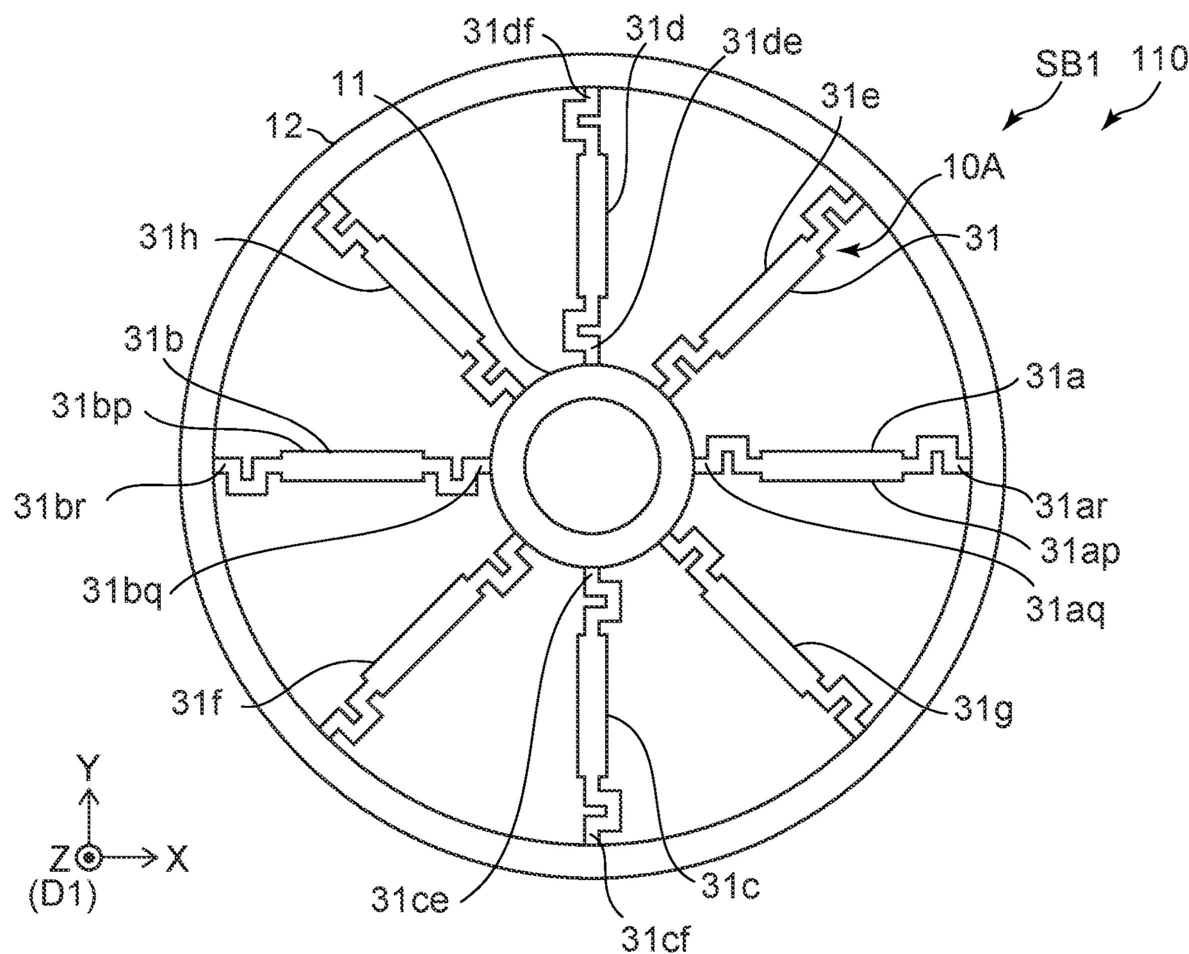
FIG. 4 is a schematic plan view illustrating the sensor according to the first embodiment.

FIG. 4 is a schematic plan view illustrating the sensor according to the first embodiment.

FIG. 4 illustrates the first support portion 11, the second support portion 12, and the first conductive member 31.

As shown in FIG. 4, for example, the first conductive portion 31*a* includes a first conductive wire 31*ap*, a first end flexible portion 31*aq*, and a first other end flexible portion 31*ar*. The first end flexible portion 31*aq* connects the end portion of the first conductive wire 31*ap* with the first support portion 11. The first other end flexible portion 31*ar* connects the other end portion of the first conductive wire 31*ap* with the second support portion 12.

For example, the second conductive portion 31*b* includes a second conductive wire 31*bp*, a second end flexible portion 31*bq*, and a second other end flexible portion 31*br*. The second end flexible portion 31*bq* connects the end portion of the second conductive wire 31*bp* with the first support portion 11. The second other end flexible portion 31*br* connects the other end portion of the second conductive wire 31*bp* with the second support portion 12.

For example, the third conductive portion 31*c* includes a third conductive wire 31*cp*, a third end flexible portion 31*cq*, and a third other end flexible portion 31*cr*. The third end flexible portion 31*cq* connects the end portion of the third conductive wire 31*cp* with the first support portion 11. The third other end flexible portion 31*cr* connects the other end portion of the third conductive wire 31*cp* with the second support portion 12.

For example, the fourth conductive portion 31*d* includes a fourth conductive wire 31*dp*, a fourth end flexible portion 31*dq*, and a fourth other end flexible portion 31*dr*. The fourth end flexible portion 31*dq* connects the end portion of the fourth conductive wire 31*dp* with the first support portion 11. The fourth other end flexible portion 31*dr* connects the other end portion of the fourth conductive wire 31*df* with the second support portion 12.

In one example, the stiffness of the first end flexible portion 31*aq* and the first other end flexible portion 31*ar* may be lower than the stiffness of the first conductive wire 31*ap*. The first end flexible portion 31*aq* and the first other end flexible portion 31*ar* are, for example, spring portions.

The stiffness of the first end flexible portion 31*aq* and the first other end flexible portion 31*ar* may be lower than the stiffness of the first support portion 11 and the second support portion 12.

In one example, the stiffness of the second end flexible portion 31*bq* and the second other end flexible portion 31*br* may be lower than the stiffness of the second conductive wire 31*bp*. The second end flexible portion 31*bq* and the second other end flexible portion 31*br* are, for example, spring portions. The stiffness of the second end flexible portion 31*bq* and the second other end flexible portion 31*br* may be lower than the stiffness of the first support portion 11 and the second support portion 12.

In one example, the stiffness of the third end flexible portion 31*cq* and the third other end flexible portion 31*cr* may be lower than the stiffness of the third conductive wire 31*cp*. The third end flexible portion 31*cq* and the third other end flexible portion 31*cr* are, for example, spring portions. The stiffness of the third end flexible portion 31*cq* and the third other end flexible portion 31*cr* may be lower than the stiffness of the first support portion 11 and the second support portion 12.

In one example, the stiffness of the fourth end flexible portion 31*dg* and the fourth other end flexible portion 31*dr* may be lower than the stiffness of the fourth conductive wire 31*dp*. The fourth end flexible portion 31*dg* and the fourth other end flexible portion 31*dr* are, for example, spring portions. The stiffness of the fourth end flexible portion 31*dg* and the fourth other end flexible portion 31*dr* may be lower than the stiffness of the first support portion 11 and the second support portion 12.

By providing the end flexible portion and the other end flexible portion, the conductive portion is easily deformed. For example, the first movable portion 10A is easily displaced. It is easy to obtain higher sensitivity.

Figure 5A:
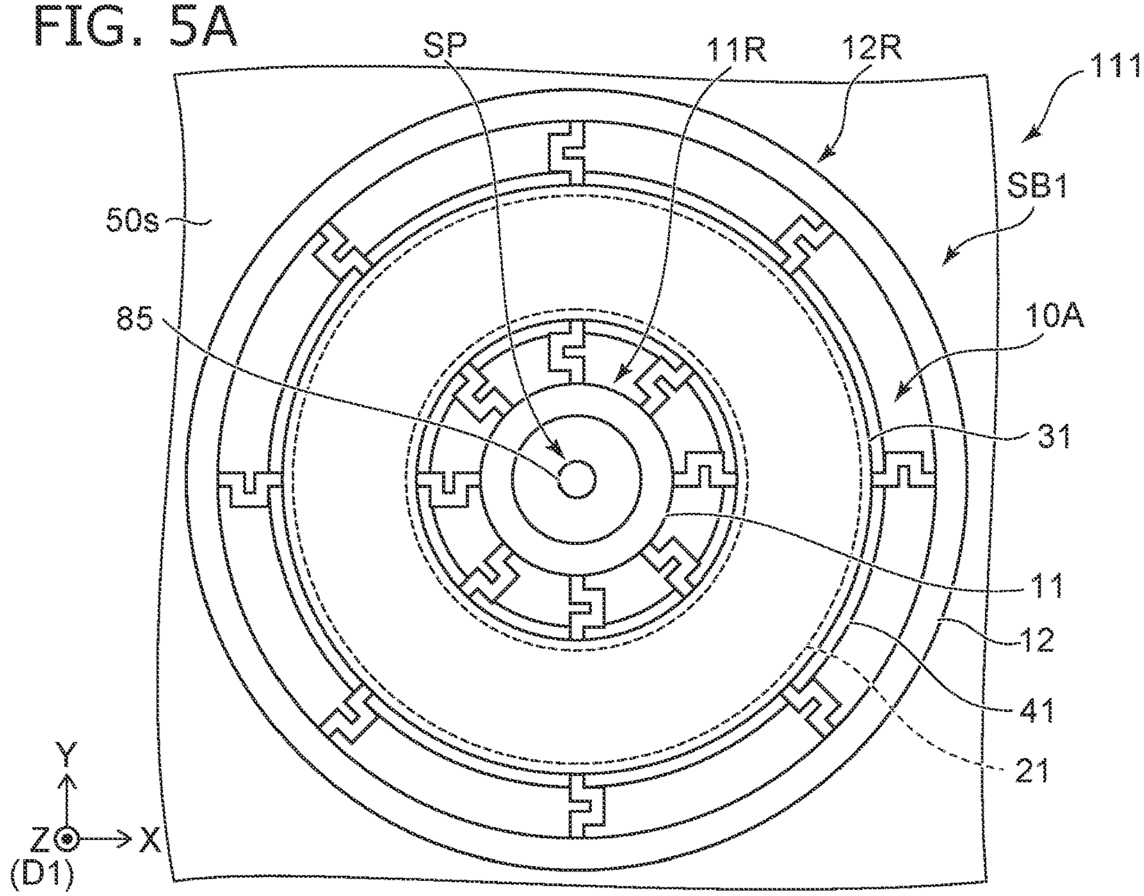
FIGS. 5A and 5B are schematic plan views illustrating a sensor according to the first embodiment.
Figure 5B:
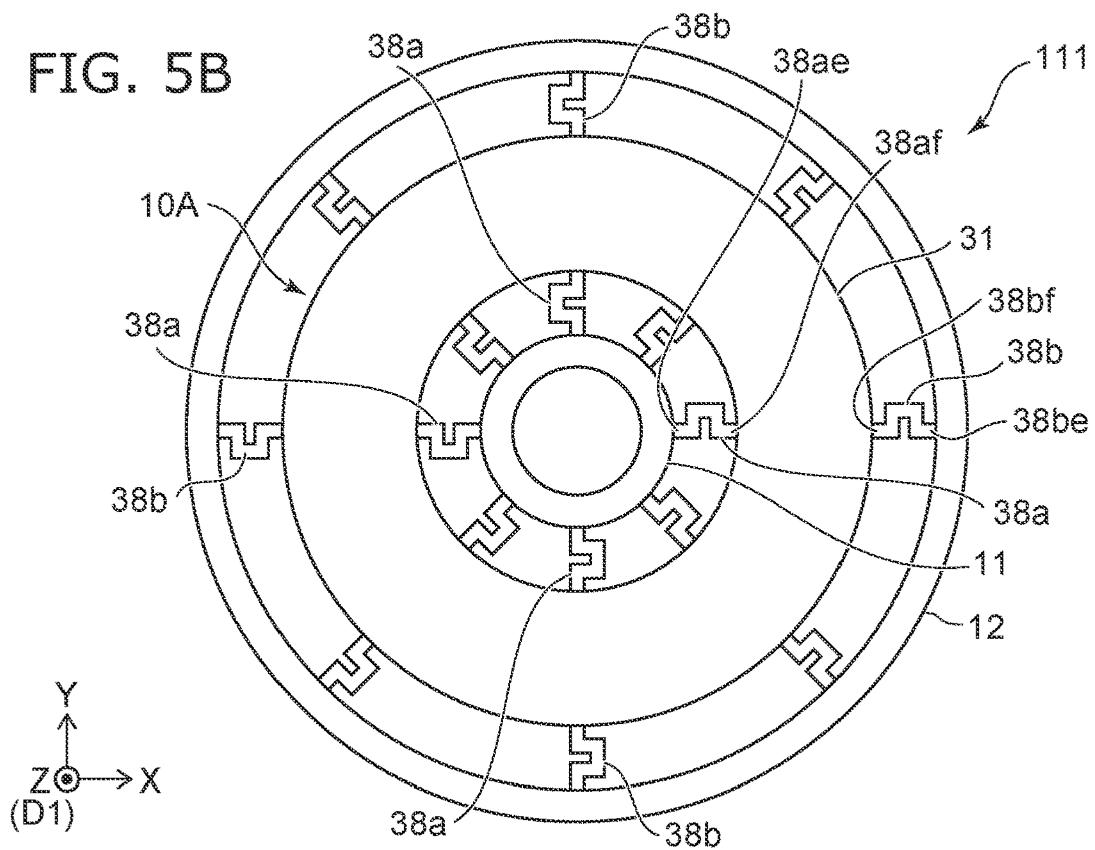

FIGS. 5A and 5B are schematic plan views illustrating a sensor according to the first embodiment.

As shown in FIG. 5A, in a sensor 111 according to the embodiment, the shape of the first conductive member 31 is different from that in the sensor 110. The configuration of the sensor 111 other than this may be the same as the configuration of the sensor 110.

As shown in FIG. 5A, in the sensor 111, the first movable portion 10A is annular. The first conductive member 31 is annular. The first structure body SB1 includes a plurality of inner flexible portions 38*a* and a plurality of outer flexible portions 38*b*. Each one end 38*ae* of the plurality of inner flexible portions 38*a* is connected with the first support portion 11. The other end 38*af* of each of the plurality of inner flexible portions 38*a* is connected with the first movable portion 10A, Each one end 38*be* of the plurality of outer flexible portions 38*b* is connected with the second support portion 12. The other end 38*bf* of each of the plurality of outer flexible portions 38*b* is connected with the first movable portion 10A.

The plurality of inner flexible portions 38*a* are arranged along the first circumferential direction Dc1 (see FIG. 2) centered on the first support portion 11. The plurality of outer flexible portions 38*b* are arranged in the first circumferential direction Dc1 (see FIG. 2).

The first movable portion 10A is supported by the plurality of inner flexible portions 38*a* and the plurality of outer flexible portions 38*b*. As a result, for example, the first movable portion 10A is easily displaced. It is easy to obtain higher sensitivity.

Figure 6A:
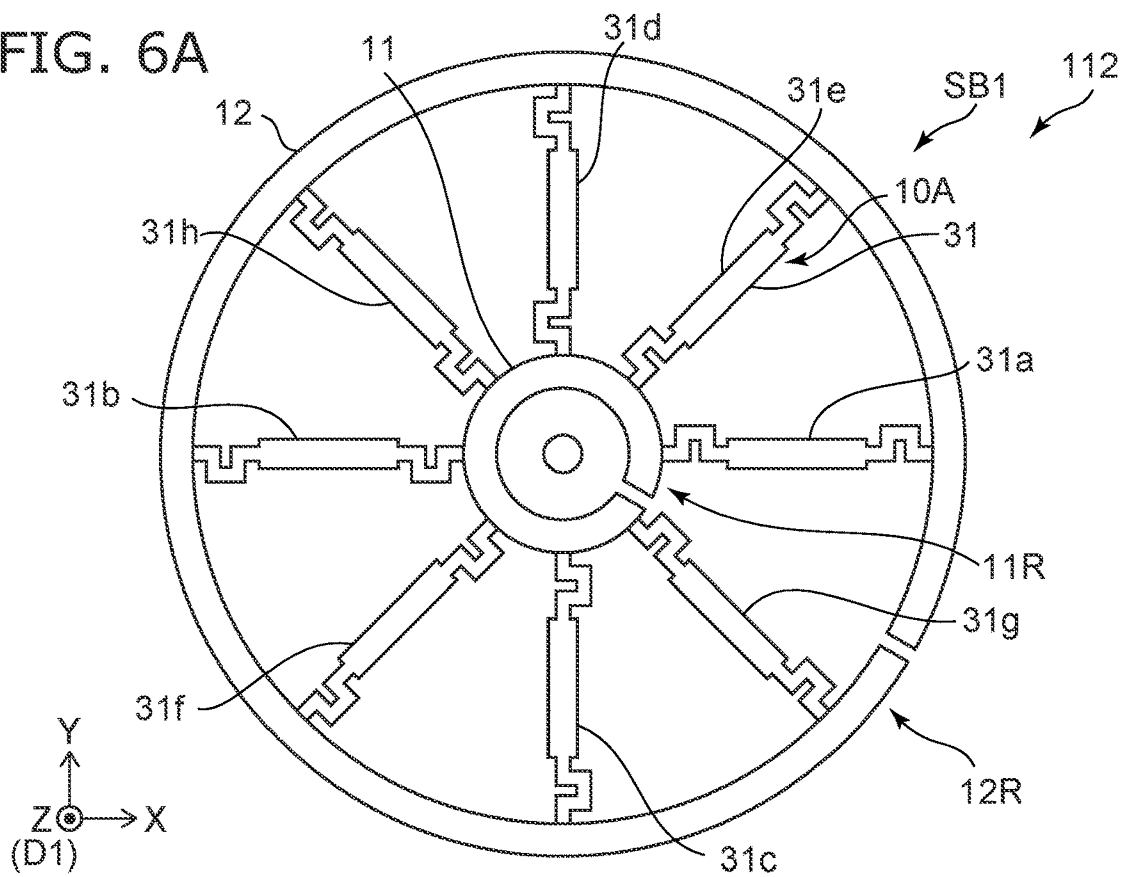
FIGS. 6A and 6B are schematic plan views illustrating sensors according to the first embodiment.
Figure 6B:
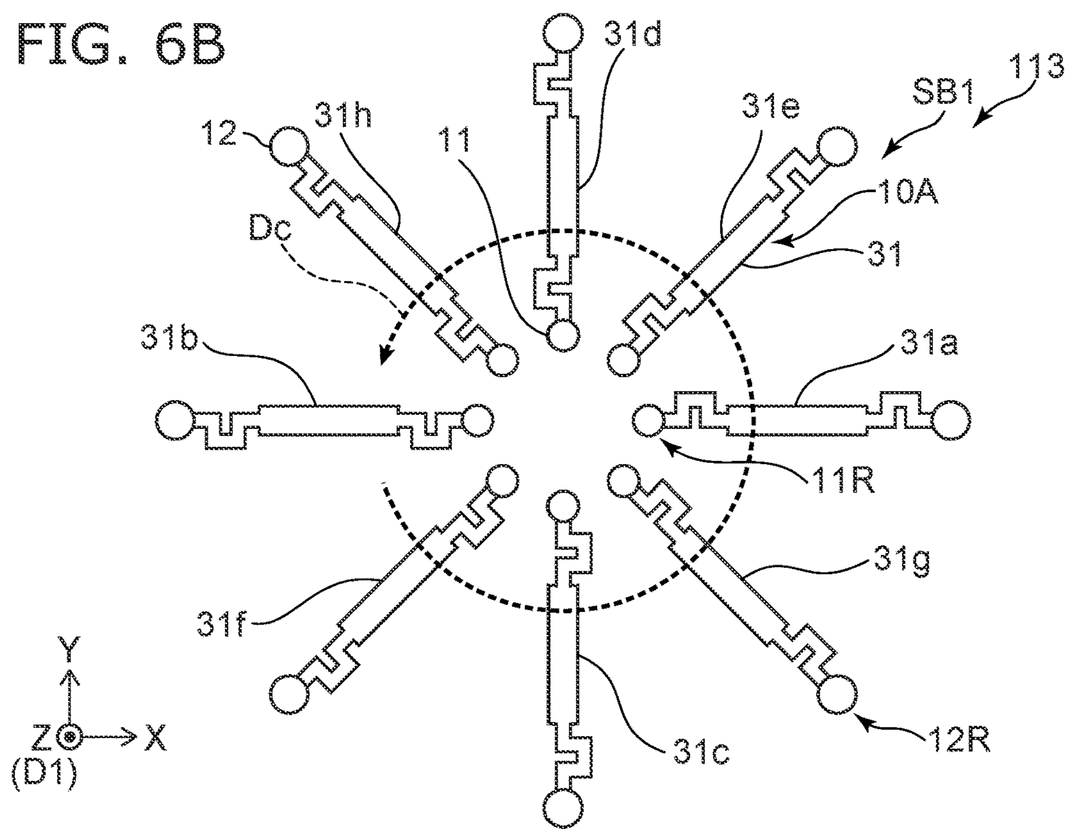

FIGS. 6A and 6B are schematic plan views illustrating sensors according to the first embodiment.

FIG. 6A illustrates a sensor 112 according to the embodiment. FIG. 6B illustrates a sensor 113 according to the embodiment. The configurations of the first support portion 11 and the second support portion 12 in the sensor 112 and the sensor 113 are different from those in the sensor 110 and the sensor 111. Except for this, the configurations of the sensor 112 and the sensor 113 may be the same as the configurations of the sensor 110 and the sensor 111.

In the sensor 112, the first support portion 11 includes one continuous first support region 11R. The first support region 11R is annular or arcuate. The second support portion 12 includes one continuous second support region 12R. The second support region 12R is annular or arcuate. In the sensor 112, the first support region 11R is an open, annular or arcuate shape that is not dosed. The second support region 12R is an open, annular or arcuate shape that is not closed. The first support portion 11 and the second support portion 12 may have such a shape. For example, the first support portion 11 and the second support portion 12 may have an arc shape having an angle exceeding 180 degrees. For example, the first support portion 11 and the second support portion 12 may have an arc shape at an angle of 270 degrees or more.

In the sensor 113, the first support portion 11 includes a plurality of first support regions 11R. The plurality of first support regions 11R are arranged in an annular or arc shape. For example, the plurality of first support regions 11R are arranged along the first circumferential direction Dc1. The second support portion 12 includes a plurality of second support regions 12R. The plurality of second support regions 12R are arranged in an annular or arc shape. For example, the plurality of second support regions 12R are arranged along the first circumferential direction Dc1. In this way, the plurality of support regions may be arranged in an annular shape or an arc shape.

The planar shape (shape in the X-Y plane) of at least one of the first support portion 11 and the second support portion 12 may be circular (including a flat circular shape) or polygonal shape. At least one of the first support portion 11 and the second support portion 12 may have a closed (continuous) shape or an open circular shape (for example, an arc shape) that is not closed.

Figure 7:
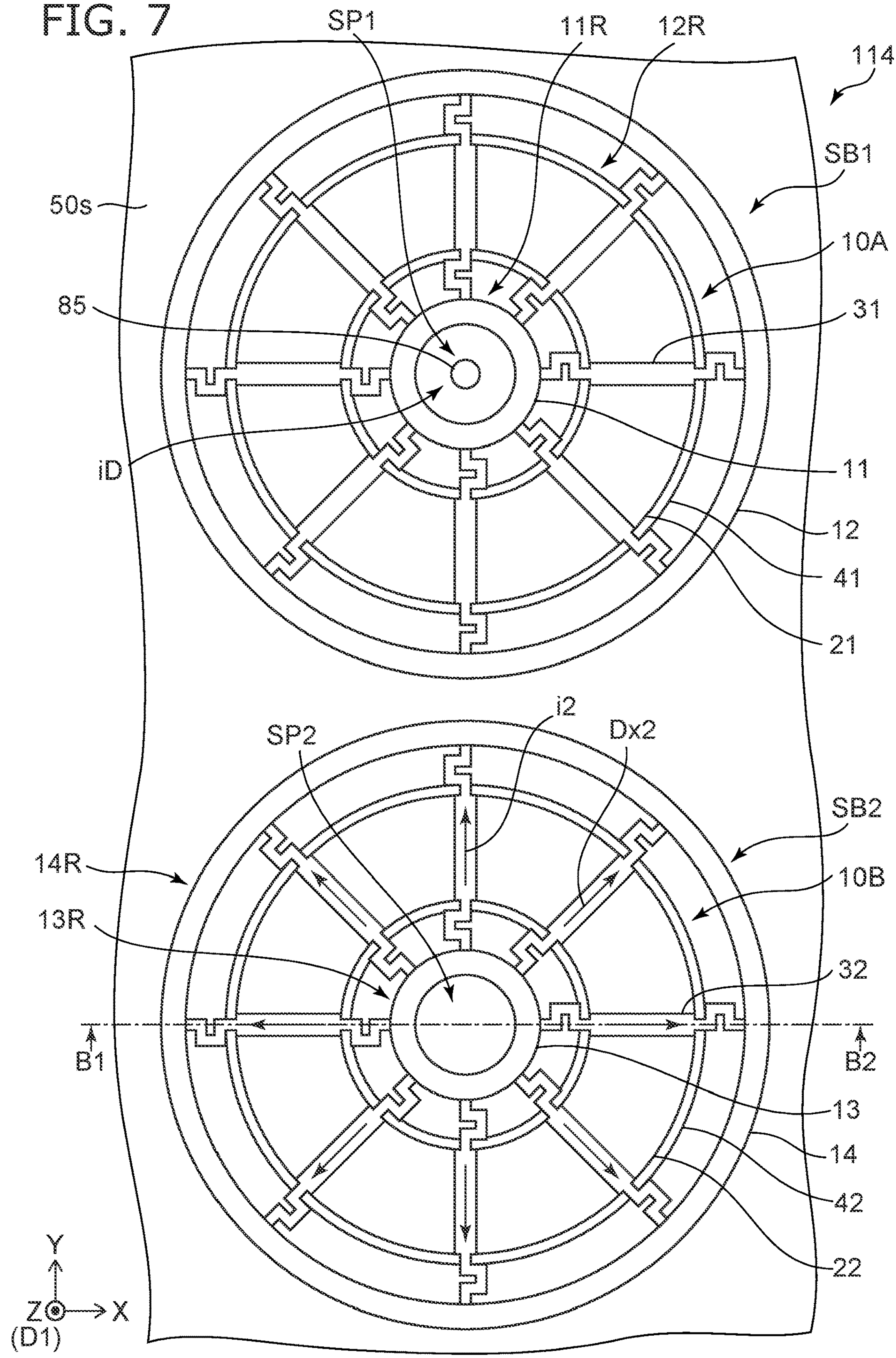
FIG. 7 is a schematic plan view illustrating a sensor according to the first embodiment.
Figure 8:
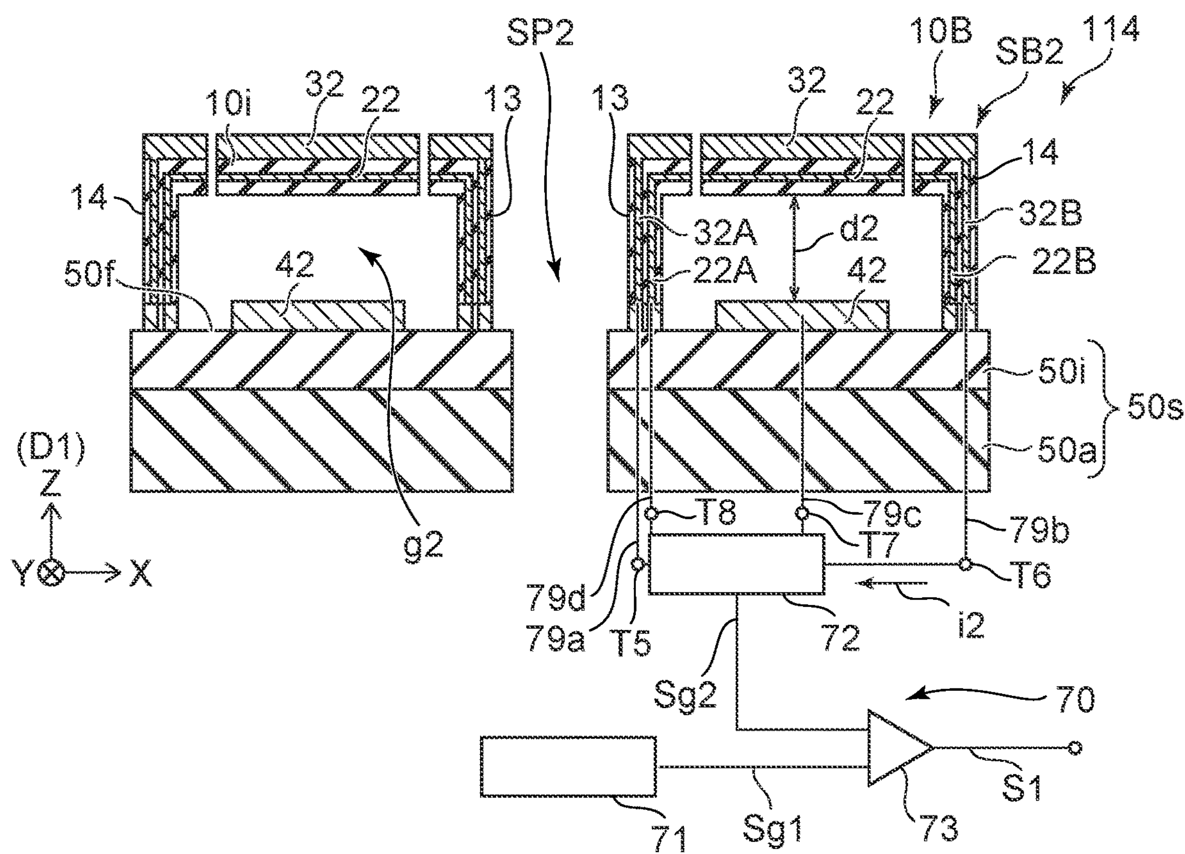
FIG. 8 is a schematic cross-sectional view illustrating the sensor according to the first embodiment.

FIG. 7 is a schematic plan view illustrating a sensor according to the first embodiment, FIG. 8 is a schematic cross-sectional view illustrating the sensor according to the first embodiment.

FIG. 8 is a cross-sectional view taken along the line B1-B2 of FIG. 7.

As shown in FIG. 7, a sensor 114 according to the embodiment includes the base 50*s*, the first structure body SB1, and a second structure body S32. The configurations of the base 50*s* and the first structure body SB1 in the sensor 114 may be the same as those configurations in the sensors 110 to 113.

As shown in FIG. 8, the second structure body SB2 is fixed to the first face 50*f* of the base 50*s*. As shown in FIGS. 7 and 8, the second structure body SB2 includes a third support portion 13, a fourth support portion 14, a second movable portion 10B, and a second fixed electrode 42.

The third support portion 13 is fixed to the first face 50*f*. The third support portion 13 includes one or more third support regions 13R. For example, one third support region 13R is annular (or arcuate). The plurality of third support regions 13R are arranged in an annular shape (or arc shape). The configuration of the first support portion 11 may be applied to the third support portion 13.

The fourth support portion 14 is fixed to the first face 50*f*. The fourth support portion 14 is provided around the third support portion 13. The fourth support portion 14 includes one or more fourth support regions 14R. For example, one fourth support region 14R is annular (or arcuate). The plurality of fourth support regions 14R are arranged in an annular shape (or arc shape). The configuration of the second support portion 12 may be applied to the fourth support portion 14.

As shown in FIG. 8, the second movable portion 10B is supported by the third support portion 13 and the fourth support portion 14. The second movable portion 10B is apart from the base 50*s* in the first direction D1. The second fixed electrode 42 is fixed to the first face 50*f*.

The second movable portion 10B includes an annular (or arc-shaped) second movable electrode 22 and a second conductive member 32. The second fixed electrode 42 faces the second movable electrode 22. A second gap g2 is provided between the second fixed electrode 42 and the second movable portion 10B.

As shown in FIG. 7, a second current i2 can flow through the second conductive member. The second current i2 is along the second radiation direction Dx2 from the third support portion 13 to the fourth support portion 14. The second current i2 has at least one of a third orientation from the third support portion 13 to the fourth support portion 14 or a fourth orientation from the fourth support portion 14 to the third support portion 13.

The second current i2 may be supplied from the controller 70. For example, the controller 70 includes a second circuit 72. For example, the second circuit 72 can supply the second current i2 to the second conductive member 32.

As shown in FIG. 8, for example, the second structure body SB2 includes fifth to eighth terminals T5 to T8. For example, the controller 70 (the second circuit 72) is electrically connected with one end of the second conductive member 32 via the fifth terminal T5, a wiring 79*a*, and the conductive portion 32A. For example, the controller 70 (second circuit 72) is electrically connected with the other end of the second conductive member 32 via the sixth terminal T6, the wiring 79*b*, and the conductive portion 32B. The second current i2 is supplied to the second conductive member 32 via the fifth terminal T5 and the sixth terminal T6.

The controller 70 (for example, the second circuit 72) can detect a change in the second capacitance between the second fixed electrode 42 and the second movable electrode 22.

The controller 70 (for example, the second circuit 72) is electrically connected with the second fixed electrode 42 via, for example, the seventh terminal T7 and a wiring 79*c*. The controller 70 (for example, the second circuit 72) is electrically connected with the second movable electrode 22 via, for example, the eighth terminal T8 and a wiring 79*d*. The controller 70 detects the second capacitance via these terminals and these wiring.

The structure of the second structure body SB2 may be the same as the structure of the first structure body SB1. The structure of the second movable portion 10B may be the same as the structure of the first movable portion 10A. The temperature of the second movable portion 10B is substantially the same as the temperature of the first movable portion 10A.

The detection target current iD can pass through the first movable portion 10A. The detection target current iD does not pass through the second movable portion 10B. By detecting the difference between the change in the first capacitance obtained from the first movable portion 10A and the change in the second capacitance obtained from the second movable portion 10B, the result in which the temperature characteristics are corrected is obtained.

As shown in FIG. 8, the sensor 114 may include a controller 70. The controller 70 can output signal S1 according to the difference between a first capacitance (first signal Sg1) and the second capacitance (second signal Sg2). The first capacitance is a capacitance between the first fixed electrode 41 and the first movable electrode 21. The second capacitance is a capacitance between the second fixed electrode 42 and the second movable electrode 22. For example, the controller 70 includes a third circuit 73. The third circuit 73 includes a differential amplifier. The first signal Sg1 and the second signal Sg2 are supplied to the third circuit 73. The third circuit 73 outputs the signal S1 corresponding to the difference between these signals.

As already explained, the first capacitance (first signal Sg1) changes according to the detection target current iD. The detection target current iD passes through the first space SP1 surrounded by the first support portion 11. The detection target current iD includes a component in the first direction D1. The detection target current iD does not pass through the second space SP2 surrounded by the third support portion 13.

The sensor 114 can detect the detection target current iD with higher accuracy.

Second Embodiment

Figure 9A:
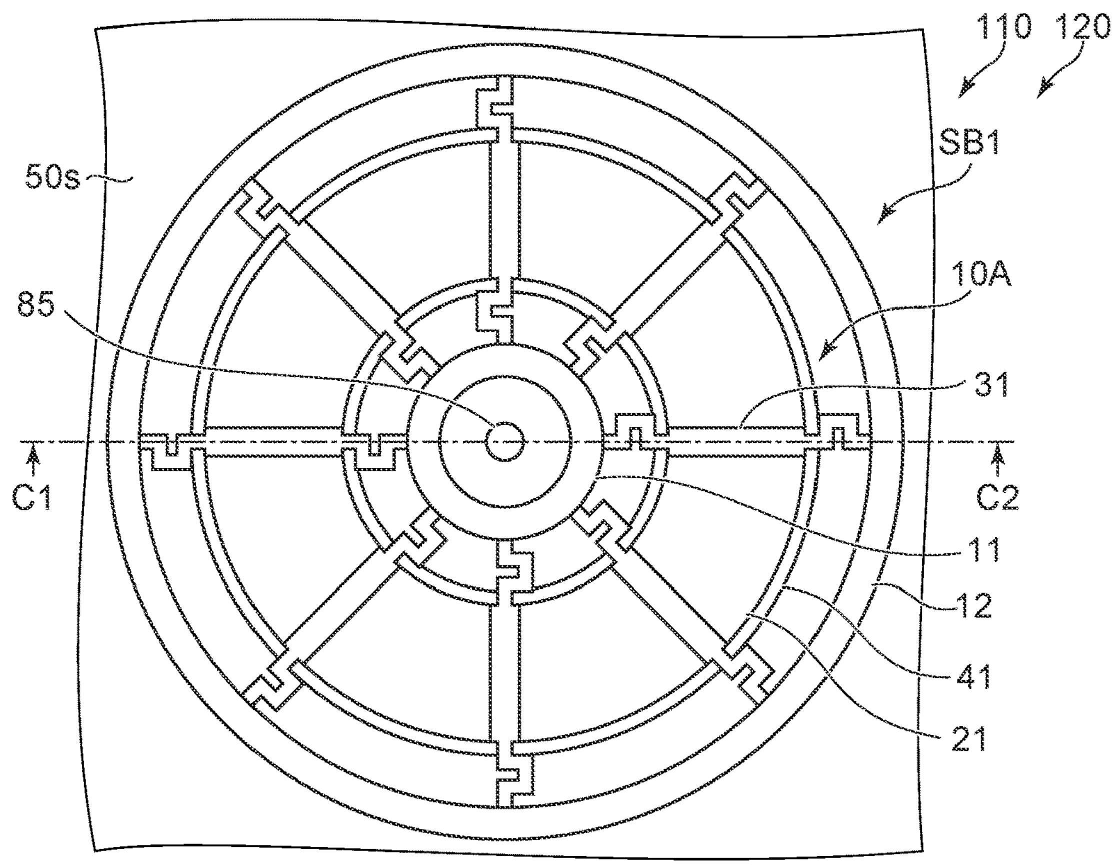
FIGS. 9A and 9B are schematic views illustrating an electric device according to a second embodiment.

FIGS. 9A and 98 are schematic views illustrating an electric device according to a second embodiment.

Figure 9B:
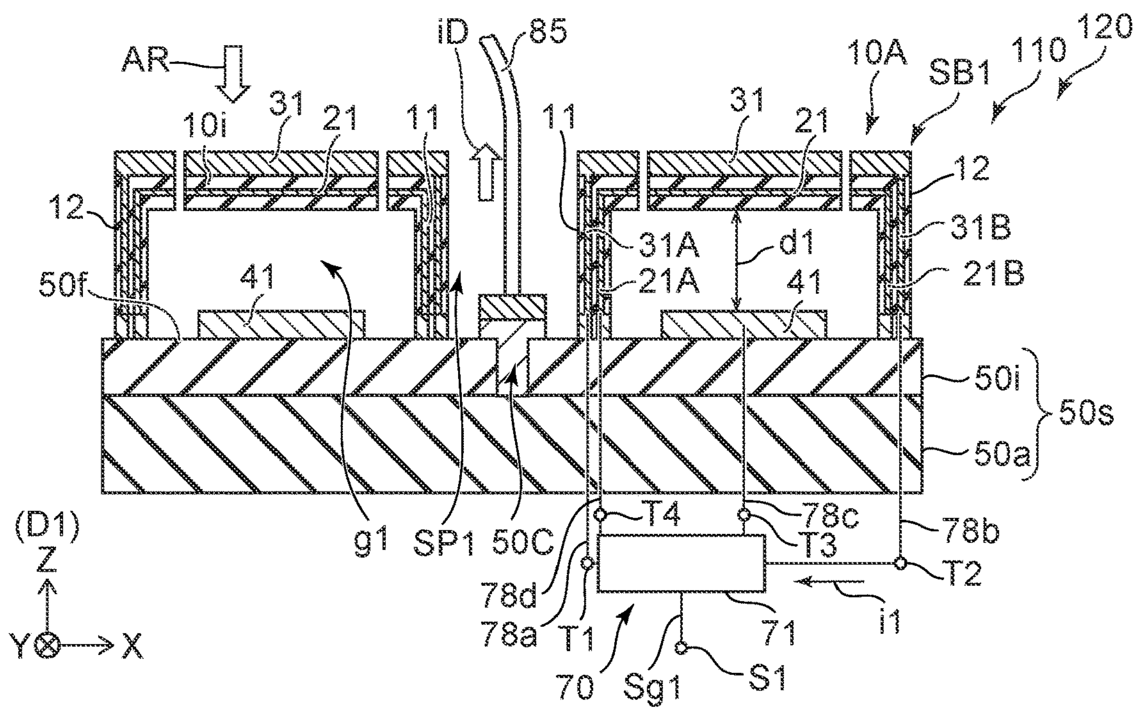

FIG. 9A is a transparent plan view seen along the arrow AR of FIG. 98, FIG. 9B is a cross-sectional view taken along the line C1-C2 of FIG. 9A.

As shown in FIGS. 9A and 9B, an electric device 120 according to the embodiment includes the sensor (for example, the sensor 110) according to the first embodiment and an electric circuit 50C. The electric circuit 50C includes the detection target wiring 85. The detection target current iD flows through the detection target wiring 85 (electric circuit 50C). The detection target current iD passes through the first space SP1 surrounded by the first support portion 11. The detection target current iD includes a component in the first direction D1.

For example, the first capacitance between the first fixed electrode 41 and the first movable electrode 21 changes according to the detection target current iD. In the electric device 120, the detection target current iD can be detected. For example, it is possible to detect an abnormality in current.

Figure 10:
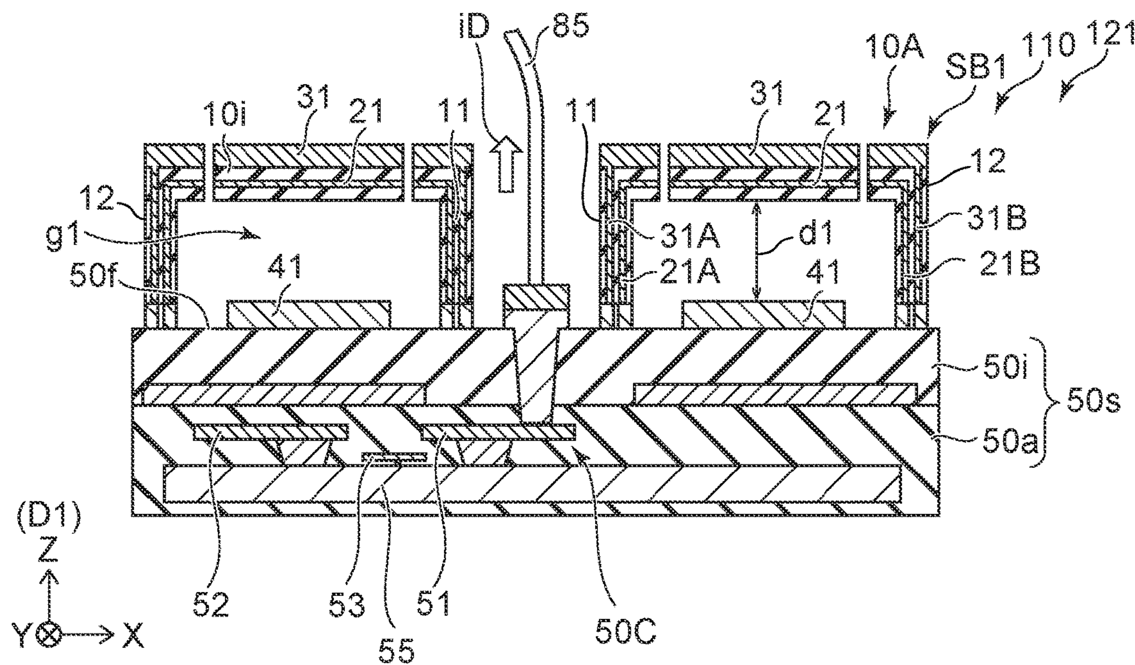
FIG. 10 is a schematic cross-sectional view illustrating an electric device according to the second embodiment.

FIG. 10 is a schematic cross-sectional view illustrating an electric device according to the second embodiment.

As shown in FIG. 10, in an electric device 121 according to the embodiment, the electric circuit 50C includes a first conductive layer 51 and the detection target wiring 85 electrically connected with the first conductive layer 51. The first fixed electrode 41 is located between the first conductive layer 51 and the first movable portion 10A. The detection target wiring 85 passes through the first space SP1. At least a part of the detection target wiring 85 is along the direction having the component of the first direction D1. The detection target wiring 85 is, for example, a bonding wire.

In this example, the electric circuit 50C includes a second conductive layer 52, a third conductive layer 53, and a semiconductor member 55. The first conductive layer 51 is, for example, a source electrode. The second conductive layer 52 is, for example, a drain electrode. The third conductive layer 53 is, for example, a gate electrode. The first conductive layer 51, the second conductive layer 52, the third conductive layer 53, and the semiconductor member 55 may be provided in the base member 50*a* being insulative, for example. A part of the base member 50*a* may be provided between the semiconductor member 55 and the third conductive layer 53.

For example, the electric circuit 50C is a transistor. In the embodiment, the electric circuit 50C may be a two-terminal element. The electric circuit 50C may include, for example, a circuit for power control (for example, a semiconductor device). The electric circuit 50C may include, for example, a diode or a power transistor. The power transistor may include, for example, a power MOSET or an insulated gate bipolar transistor (IGBT). The electric circuit 50C may include, for example, a thyristor, a gate turn-off thyristor (GTO), a triac, or the like.

Figure 11:
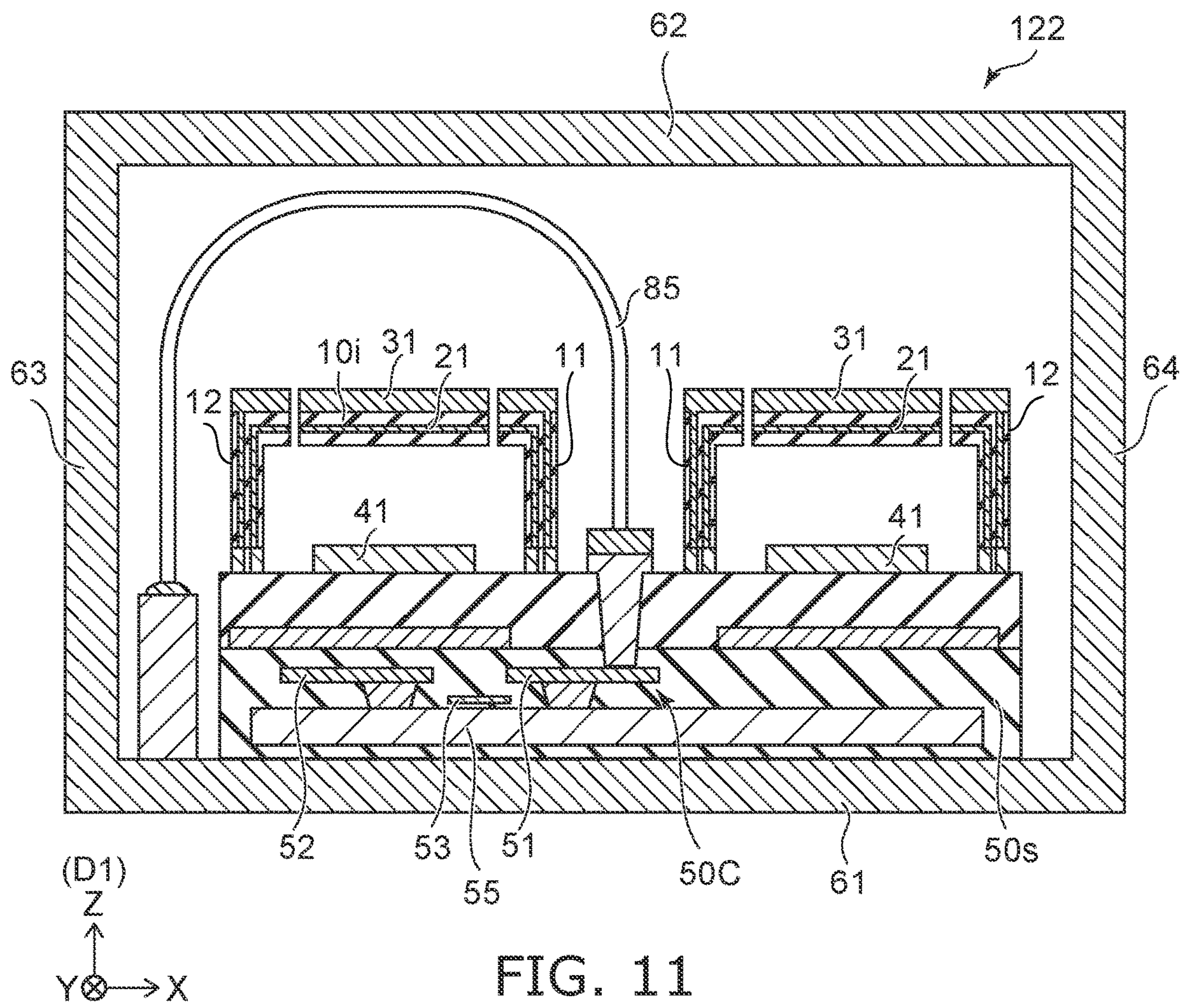
FIG. 11 is a schematic cross-sectional view illustrating a sensor according to the second embodiment.

FIG. 11 is a schematic cross-sectional view illustrating a sensor according to the second embodiment.

As shown in FIG. 11, an electric device 122 according to the embodiment includes the sensor (for example, the sensor 110) according to the first embodiment, the electric circuit 50C, and first member 61 to fourth member 64. The base 50*s* and the first structure body SB1 are provided between the first member 61 and the second member 62. At least one of the first member 61 and the second member 62 functions as a magnetic shield. At least one of the first member 61 and the second member 62 attenuates an external magnetic field. By providing a magnetic shield, more stable and highly accurate detection becomes possible.

In this example, a direction from the first member 61 to the second member 62 is along the first direction (Z-axis direction).

The base 50*s* and the first structure body SB1 are provided between the third member 63 and the fourth member 64. At least one of the third member 63 and the fourth member 64 functions as a magnetic shield. At least one of the third member 63 and the fourth member 64 attenuates an external magnetic field. By providing a magnetic shield, more stable and highly accurate detection becomes possible. In this example, the direction from the first member 61 to the second member 62 is along the X-Y plane.

The embodiments may include following configurations (for example, technical proposals).

Configuration 1

A sensor, comprising:

a base including a first face; and a first structure body fixed to the first face, the first structure body including:

a first support portion fixed to the first surface, the first support portion including one or a plurality of first support regions, the one first support region being annular, and the first support regions being arranged annularly, a second support portion fixed to the first face and provided around the first support portion, the second support portion including one or a plurality of second support regions, the one second support region being annular, the second support regions being arranged annularly, a first movable portion supported by the first support portion and the second support portion and apart from the base in a first direction crossing the first face, and a first fixed electrode being annular and fixed to the first face, the first movable portion including;

a first movable electrode being annular, a first conductive member, a first current being configured to flow the first conductive member, the first current being along a first radial direction from the first support portion to the second support portion, the first current having at least one of a first orientation from the first support portion to the second support portion or a second orientation from the second support portion to the first support portion, the first fixed electrode facing the first movable electrode, and a first gap being provided between the first fixed electrode and the first movable portion.

Configuration 2

The sensor according to Configuration 1, wherein the first movable electrode is between the first fixed electrode and the first conductive member in the first direction.

Configuration 3

The sensor according to Configuration 1 or 2, wherein the first structure body includes;

a plurality of inner flexible portions, and a plurality of outer flexible portions, one end of each of the inner flexible portions is connected with the first support portion, and an other end of each of the inner flexible portions is connected with the first movable portion, and one end of each of the outer flexible portions is connected with the second support portion, an other end of each of the outer flexible portions is connected with the first movable portion, Configuration 4

The sensor according to Configuration 3, wherein the inner flexible portions are arranged along a first circumferential direction centered on the first support portion, and the plurality of outer flexible portions are arranged along the first circumferential direction.

Configuration 5

The sensor according to Configuration 1 or 2, wherein

The first conductive member includes a first conductive portion and a second conductive portion, the first conductive portion includes a first conductive portion end and a first conductive portion other end, the first conductive portion end is connected with the first support portion, the first conductive portion other end is connected with the second support portion, and the second conductive portion includes a second conductive portion end and a second conductive portion other end, the second conductive portion end is connected with the first support portion, the second conductive portion other end is connected with the second support portion.

Configuration 6

The sensor according to Configuration 5, wherein a direction from the first conductive portion end to the first conductive portion other end is along a direction from the second conductive portion other end to the second conductive portion end.

Configuration 7

The sensor according to Configuration 5, wherein a direction from the first conductive portion end to the first conductive portion other end crosses a direction from the second conductive portion other end to the second conductive portion end.

Configuration 8

The sensor according to Configuration 5, wherein

The first conductive member includes a third conductive portion and a fourth conductive portion, the third conductive portion includes a third conductive portion end and a third conductive portion other end, the third conductive portion end is connected with the first support portion, the third conductive portion other end is connected with the second support portion, and the fourth conductive portion includes a fourth conductive portion end and a fourth conductive portion other end, the fourth conductive portion end is connected with the first support portion, the fourth conductive portion other end is connected with the second support portion, a direction from the first conductive portion end to the first conductive portion other end is along a direction from the second conductive portion other end to the second conductive portion end, a direction from the third conductive portion end to the third conductive portion other end is along a direction from the fourth conductive portion other end to the fourth conductive portion end, and the direction from the first conductive portion end to the first conductive portion other end crosses the direction from the third conductive portion end to the third conductive portion other end Configuration 9

The sensor according to Configuration 8, wherein the third conductive portion includes a third conductive wire, a third end flexible portion, and a third other end flexible portion, the third end flexible portion connects an end portion of the third conductive wire with the first support portion, the third other end flexible portion connects the other end of the third conductive wire with the second support portion, the fourth conductive portion includes a fourth conductive wire, a fourth end flexible portion, and a fourth other end flexible portion, the fourth end flexible portion connects an end portion of the fourth conductive wire with the first support portion, and the fourth other end flexible portion connects the other end of the fourth conductive wire with the second support portion.

Configuration 10

The sensor according to one of Configuration 5-9, wherein the first conductive portion includes a first conductive wire, a first end flexible portion, and a first other end flexible portion, the first end flexible portion connects an end portion of the first conductive wire with the first support portion, the first other end flexible portion connects an other end of the first conductive wire with the second support portion, the second conductive portion includes a second conductive wire, a second end flexible portion, and a second other end flexible portion, the second end flexible portion connects an end portion of the second conductive wire with the first support portion, and the second other end flexible portion connects an other end of the second conductive wire with the second support portion.

Configuration 11

The sensor according to one of Configuration 1-10, wherein a first distance between the first fixed electrode and the first movable portion changes according to a detection target current, the detection target current passes through a first space, the first support portion is around the first space, and the detection target current includes a component in the first direction.

Configuration 12

The sensor according to one of Configuration 1-11, wherein a first capacitance between the first fixed electrode and the first movable electrode changes according to a detection target current, the detection target current passes through a first space, the first support portion is around the first space, and the detection target current includes a component in the first direction.

Configuration 13

The sensor according to one of Configuration 1-11, further comprising a controller configured to supply a first current to the first conductive member.

Configuration 14

The sensor according to Configuration 13, wherein the controller is configured to detect a change in the first capacitance between the first fixed electrode and the first movable electrode.

Configuration 15

The sensor according to Configuration 14, wherein the first capacitance changes according to a detection target current, the detection target current passes through a first space, the first support portion is around the first space, and the detection target current includes a component in the first direction.

Configuration 16

The sensor according to one of Configurations 1-11, further comprising a second structure body fixed to the first face, the second structure body including:

a third support portion fixed to the first surface, the third support portion including one or a plurality of third support regions, the one third support region being annular, and the third support regions being arranged annularly, a fourth support portion fixed to the first face and provided around the third support portion, the fourth support portion including one or a plurality of fourth support regions, the one fourth support region being annular, the fourth support regions being arranged annularly, a second movable portion supported by the third support portion and the fourth support portion and apart from the base in the first direction, and a second fixed electrode being annular and fixed to the first face, the second movable portion including;

a second movable electrode being annular, a second conductive member, the second fixed electrode facing the second movable electrode, and a second gap being provided between the second fixed electrode and the second movable portion.

Configuration 17

The sensor according to Configuration 16, wherein a second current is configured to flow the second conductive member, the second current is along a second radial direction from the third support portion to the fourth support portion, and the second current has at least one of a third orientation from the third support portion to the fourth support portion or a fourth orientation from the fourth support portion to the third support portion.

Configuration 18

The sensor according to Configuration 16 or 17, further comprising a controller, the controller being configured to output a signal according to a difference between a first capacitance between the first fixed electrode and the first movable electrode, and a second capacitance between the second fixed electrode and the second movable electrode, the first capacitance being configured change according to a detection target current, the detection target current being configured to pass through a first space, the first support portion being around the first space, and the detection target current including a component in the first direction.

Configuration 19

An electric device, comprising:

the sensor according to one of Configurations 1-10; and an electric circuit, a detection target current being configured to flow through the electric circuit, the detection target current being configured to pass through a first space, the first support portion being around the first space, and the detection target current including a component in the first direction.

Configuration 20

The device according to Configuration 19, wherein the electric circuit includes;

a first conductive layer, and a detection target wiring electrically connected with the first conductive layer, the first fixed electrode is located between the first conductive layer and the first movable portion, the detection target wiring passes through the first space, at least a part of the detection target wiring is along the direction having a component in the first direction.

Configuration 21

A sensor, comprising:

a base including a first face; and a first structure body fixed to the first face, the first structure body including:

a first support portion fixed to the first surface, the first support portion including one or a plurality of first support regions, a second support portion fixed to the first face and provided around the first support portion, the second support portion including one or a plurality of second support regions, a first movable portion supported by the first support portion and the second support portion and apart from the base in a first direction crossing the first face, and a first fixed electrode fixed to the first face, the first movable portion including;

a first movable electrode, a first conductive member, a first current being configured to flow the first conductive member, the first current being along a first radial direction from the first support portion to the second support portion, the first current having at least one of a first orientation from the first support portion to the second support portion or a second orientation from the second support portion to the first support portion, the first fixed electrode facing the first movable electrode, and a first gap being provided between the first fixed electrode and the first movable portion.

According to embodiments, practical sensors and electric devices can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as bases, support portions, movable portions, fixed electrodes, controller, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and electric devices practicable by an appropriate design modification by one skilled in the art based on the sensors and the electric devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:

a base including a first face; and a first structure body fixed to the first face, the first structure body including:

a first support portion fixed to the first surface, the first support portion including one or a plurality of first support regions, the one first support region being annular, and the first support regions being arranged annularly, a second support portion fixed to the first face and provided around the first support portion, the second support portion including one or a plurality of second support regions, the one second support region being annular, the second support regions being arranged annularly, a first movable portion supported by the first support portion and the second support portion and apart from the base in a first direction crossing the first face, and a first fixed electrode being annular and fixed to the first face, the first movable portion including:

a first movable electrode being annular, a first conductive member configured to conduct a first current flowing along a first radial direction from the first support portion to the second support portion, the first current having at least one of a first orientation from the first support portion to the second support portion or a second orientation from the second support portion to the first support portion, the first fixed electrode facing the first movable electrode, and a first gap being provided between the first fixed electrode and the first movable portion.

2. The sensor according to claim 1, wherein the first movable electrode is between the first fixed electrode and the first conductive member in the first direction.

3. The sensor according to claim 1, wherein the first structure body includes;

a plurality of inner flexible portions, and a plurality of outer flexible portions, one end of each of the inner flexible portions is connected with the first support portion, and an other end of each of the inner flexible portions is connected with the first movable portion, and one end of each of the outer flexible portions is connected with the second support portion, an other end of each of the outer flexible portions is connected with the first movable portion.

4. The sensor according to claim 3, wherein the inner flexible portions are arranged along a first circumferential direction centered on the first support portion, and the plurality of outer flexible portions are arranged along the first circumferential direction.

5. The sensor according to claim 1, wherein

The first conductive member includes a first conductive portion and a second conductive portion, the first conductive portion includes a first conductive portion end and a first conductive portion other end, the first conductive portion end is connected with the first support portion, the first conductive portion other end is connected with the second support portion, and the second conductive portion includes a second conductive portion end and a second conductive portion other end, the second conductive portion end is connected with the first support portion, the second conductive portion other end is connected with the second support portion.

6. The sensor according to claim 5, wherein a direction from the first conductive portion end to the first conductive portion other end is along a direction from the second conductive portion other end to the second conductive portion end.

7. The sensor according to claim 5, wherein a direction from the first conductive portion end to the first conductive portion other end crosses a direction from the second conductive portion other end to the second conductive portion end.

8. The sensor according to claim 5, wherein the first conductive member includes a third conductive portion and a fourth conductive portion, the third conductive portion includes a third conductive portion end and a third conductive portion other end, the third conductive portion end is connected with the first support portion, the third conductive portion other end is connected with the second support portion, and the fourth conductive portion includes a fourth conductive portion end and a fourth conductive portion other end, the fourth conductive portion end is connected with the first support portion, the fourth conductive portion other end is connected with the second support portion, a direction from the first conductive portion end to the first conductive portion other end is along a direction from the second conductive portion other end to the second conductive portion end, a direction from the third conductive portion end to the third conductive portion other end is along a direction from the fourth conductive portion other end to the fourth conductive portion end, and the direction from the first conductive portion end to the first conductive portion other end crosses the direction from the third conductive portion end to the third conductive portion other end.

9. The sensor according to claim 8, wherein the third conductive portion includes a third conductive wire, a third end flexible portion, and a third other end flexible portion, the third end flexible portion connects an end portion of the third conductive wire with the first support portion, the third other end flexible portion connects the other end of the third conductive wire with the second support portion, the fourth conductive portion includes a fourth conductive wire, a fourth end flexible portion, and a fourth other end flexible portion, the fourth end flexible portion connects an end portion of the fourth conductive wire with the first support portion, and the fourth other end flexible portion connects the other end of the fourth conductive wire with the second support portion.

10. The sensor according to claim 5, wherein
the first conductive portion includes a first conductive wire, a first end flexible portion, and a first other end flexible portion,
the first end flexible portion connects an end portion of the first conductive wire with the first support portion,
the first other end flexible portion connects an other end of the first conductive wire with the second support portion,
the second conductive portion includes a second conductive wire, a second end flexible portion, and a second other end flexible portion,
the second end flexible portion connects an end portion of the second conductive wire with the first support portion, and
the second other end flexible portion connects an other end of the second conductive wire with the second support portion.

11. The sensor according to claim 1, wherein
a first distance between the first fixed electrode and the first movable portion changes according to a detection target current,
the detection target current passes through a first space,
the first support portion is around the first space, and
the detection target current includes a component in the first direction.

12. The sensor according to claim 1, wherein
a first capacitance between the first fixed electrode and the first movable electrode changes according to a detection target current,
the detection target current passes through a first space,
the first support portion is around the first space, and
the detection target current includes a component in the first direction.

13. The sensor according to claim 1, further comprising a controller configured to supply a first current to the first conductive member.

14. The sensor according to claim 13, wherein the controller is configured to detect a change in the first capacitance between the first fixed electrode and the first movable electrode.

15. The sensor according to claim 14, wherein
the first capacitance changes according to a detection target current,
the detection target current passes through a first space,
the first support portion is around the first space, and
the detection target current includes a component in the first direction.

16. The sensor according to claim 1, further comprising a second structure body fixed to the first face,
the second structure body including:
a third support portion fixed to the first surface, the third support portion including one or a plurality of third support regions, the one third support region being annular, and the third support regions being arranged annularly,
a fourth support portion fixed to the first face and provided around the third support portion, the fourth support portion including one or a plurality of fourth support regions, the one fourth support region being annular, the fourth support regions being arranged annularly,
a second movable portion supported by the third support portion and the fourth support portion and apart from the base in the first direction, and
a second fixed electrode being annular and fixed to the first face,
the second movable portion including;
a second movable electrode being annular,
a second conductive member,
the second fixed electrode facing the second movable electrode, and
a second gap being provided between the second fixed electrode and the second movable portion.

17. The sensor according to claim 16, wherein
a second current is configured to flow the second conductive member,
the second current is along a second radial direction from the third support portion to the fourth support portion, and
the second current has at least one of a third orientation from the third support portion to the fourth support portion or a fourth orientation from the fourth support portion to the third support portion.

18. The sensor according to claim 16, further comprising a controller,
the controller being configured to output a signal according to a difference between a first capacitance between the first fixed electrode and the first movable electrode, and a second capacitance between the second fixed electrode and the second movable electrode,
the first capacitance being configured change according to a detection target current,
the detection target current being configured to pass through a first space,
the first support portion being around the first space, and
the detection target current including a component in the first direction.

19. An electric device, comprising:
the sensor according to claim 1; and
an electric circuit,
a detection target current being configured to flow through the electric circuit,
the detection target current being configured to pass through a first space,
the first support portion being around the first space, and
the detection target current including a component in the first direction.

20. The device according to claim 19, wherein
the electric circuit includes;
a first conductive layer, and
a detection target wiring electrically connected with the first conductive layer,
the first fixed electrode is located between the first conductive layer and the first movable portion,
the detection target wiring passes through the first space,
at least a part of the detection target wiring is along the direction having a component in the first direction.

* * * * *